United States Patent
Plager et al.

(10) Patent No.: US 9,496,829 B2
(45) Date of Patent: Nov. 15, 2016

(54) AMPLIFIER ARRANGEMENT COMPRISING A LOW-PASS FILTER DEVICE

(71) Applicant: Robert Bosch GmbH, Stuttgart (DE)

(72) Inventors: Josef Plager, Bogen (DE); Patrick Engl, Rattiszell (DE); Thomas Stein, Regensburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/598,320

(22) Filed: Jan. 16, 2015

(65) Prior Publication Data
US 2015/0207473 A1    Jul. 23, 2015

(30) Foreign Application Priority Data

Jan. 21, 2014   (DE) ........................ 10 2014 200 964

(51) Int. Cl.
*H03F 3/217*   (2006.01)
*H03F 3/185*   (2006.01)

(52) U.S. Cl.
CPC ............ *H03F 3/185* (2013.01); *H03F 3/2171* (2013.01); *H03F 3/2173* (2013.01); *H03F 3/217* (2013.01); *H03F 2200/03* (2013.01); *H03F 2200/171* (2013.01)

(58) Field of Classification Search
CPC ..................... H03F 2200/03; H03F 2200/351; H03F 3/217; H03F 3/2173; H03F 1/0205; H03F 3/183; H03F 3/211; H03F 1/32; H03F 2203/21106; H03F 3/185; H03F 3/2171; H03F 1/0211; H03F 1/3205; H03F 1/3247

USPC ..................................................... 330/10, 251
See application file for complete search history.

(56) References Cited

U.S. PATENT DOCUMENTS

| 4,968,948 | A  | * | 11/1990 | Tokumo | ................... | H03H 7/09 330/10 |
| 6,281,767 | B1 | * | 8/2001 | Lastrucci | .............. | H03F 3/2173 330/251 |
| 7,456,685 | B2 | * | 11/2008 | Chen | ....................... | H03F 3/217 330/10 |
| 7,501,889 | B2 | * | 3/2009 | Mendenhall | ............ | H03F 3/217 330/251 |
| 7,932,777 | B1 | * | 4/2011 | Zipfel, Jr. | .............. | H02N 2/065 330/10 |
| 2008/0309406 | A1 | | 12/2008 | Jonkman | | |

FOREIGN PATENT DOCUMENTS

| DE | 112006003184 | 10/2008 |
| WO | 2007063490 | 6/2007 |

* cited by examiner

*Primary Examiner* — Khanh V Nguyen
(74) *Attorney, Agent, or Firm* — Michael Best & Friedrich LLP

(57) ABSTRACT

An amplifier arrangement with a Class D design is proposed which has a low-pass filter device comprising a first inductor and a second inductor The first inductor is arranged between a first load output and a load and the second inductor is arranged between a second load output and the load. The first and second inductors are coupled to one another so that the total inductance of the two inductors is greater than the sum of the individual inductances of the two inductors and also less than or equal to 1.95 times the sum of the individual inductances of the two inductors.

11 Claims, 2 Drawing Sheets

AMPLIFIER ARRANGEMENT COMPRISING A LOW-PASS FILTER DEVICE

BACKGROUND OF THE INVENTION

The invention relates to an amplifier arrangement for amplifying an audio signal.

Amplifiers are used for amplifying an audio input signal to give an amplified audio output signal, wherein the amplitude of the audio output signal is higher than the amplitude of the audio input signal. In addition to a multiplicity of analog amplifiers, so-called Class D amplifiers have become established on the market owing to the low number of component parts required and the high efficiency. In the case of Class D amplifiers, the incoming audio signal is converted into a pulse-width-modulated signal, which is then amplified by virtue of switching devices being opened and closed by the pulse-width-modulated signal. The resultant, amplified, pulse-width-modulated signal is converted into the amplified audio output signal using a low-pass filter.

The document DE 11 2006 003 184 T5, which is based on WO 2007/063490 and forms what is believed to be the closest prior art, discloses a full-bridge Class D power amplifier. The amplification part of the full-bridge power amplifier is implemented via two circuit branches, each having two controllable switches. The circuit branches each form a connection, via which a load, in particular a loudspeaker, can be connected. In each case one low-pass filter with a coil and a capacitor is arranged between the connection points and the load.

SUMMARY OF THE INVENTION

Within the context of the invention, an amplifier arrangement is proposed.

In accordance with the invention, an amplifier arrangement is proposed which is suitable and/or designed for amplifying an audio input signal to give an audio output signal. The audio input signal can originate, for example, from a microphone or from another audio source. The audio input signal is in particular in the form of an analog signal.

The amplifier arrangement comprises a PWM module, which is designed to convert the audio input signal into a pulse-width-modulated (PWM) intermediate signal. For example, the PWM module can be in the form of a subordinate switching group, wherein a comparator compares the incoming audio input signal with a delta voltage and outputs a high signal or a low signal depending on the result. The resultant pulse-width-modulated intermediate signal has the frequency of the delta voltage to which the audio input signal has been modulated, wherein the audio input signal has been modulated by a different temporal length of the high or low signal sections in the pulse-width-modulated intermediate signal. Other possibilities for generating the pulse-width-modulated intermediate signal are also possible.

The amplifier arrangement has a wiring arrangement with a full-bridge configuration comprising a first and a second half-bridge. The two half-bridges are arranged electrically in parallel with one another and each extend between a first and a second supply line of a voltage supply. The supply lines can also be referred to as rail voltage. In particular, the voltage supply can be in the form of a floating voltage supply. The first and second half-bridges each have two switching devices so that the wiring arrangement with a full-bridge configuration comprises in total four switching devices. In the case of the first half-bridge, two switching devices are connected in series, and in the case of the second half-bridge, likewise two switching devices are connected in series. In the case of the first half-bridge, there is a first load output point and in the case of the second half-bridge there is a second load output point between the switching devices. The amplified, pulse-width-modulated intermediate signal is present at the two load output points.

The switching devices are each actuated via the pulse-width-modulated intermediate signal in such a way that switching devices of the two half-bridges which are arranged diagonally with respect to one another are activated and deactivated at least theoretically at the same time. For example, the switching devices are in the form of MOS-FETs, wherein in each case the same signal is present at the gate of the switching devices arranged diagonally with respect to one another. In particular, one line of the pulse-width-modulated intermediate signal is present at a pair of switching devices arranged diagonally with respect to one another, and the other line of the pulse-width-modulated intermediate signal is present at the other two switching devices. The switching devices are actuated via the intermediate signal in such a way that, in a first state, which corresponds to a high state of the pulse-width-modulated intermediate signal, for example, in each case one switching device of the half-bridges is switched on, and the other switching devices are switched off so that the first load output point is conductively connected to the first supply line and the second load output point is conductively connected to the second supply line. In a second state, for example in a low state of the pulse-width-modulated intermediate signal, in each case the other switching devices are switched on or switched off so that the first load output point is conductively connected to the second supply line and the second load output point is conductively connected to the first supply line.

The load output points are connected and/or connectable to a load, in particular a loudspeaker, via a low-pass filter device.

The low-pass filter device comprises a first and a second inductor. The inductors are in particular in the form of coils. The first inductor is arranged between the first load output and the load, and the second inductor is arranged between the second load output and the load.

Within the scope of the invention, it is proposed that the first and second inductors are in particular magnetically coupled to one another so that the total inductance of the two inductors is greater than simply the sum of the individual inductances and is at the same time less than or equal to 1.95 times the sum of the individual inductances. As an alternative or in addition, it is claimed that the leakage inductance of the coupled inductors is greater than or equal to 10% of the individual inductance of the first or second inductor. Particularly preferably, the coupling factor of the inductor assembly is less than 0.95 and/or greater than 0.7, preferably greater than 0.8. Particularly preferably, the first and/or the second inductor(s) are/is in the form of a cylinder coil.

This configuration can also be illustrated as follows:

The coupling factor k is calculated as follows:

$$k = \sqrt{1 - \frac{\text{Leakage inductance}}{\text{Individual inductance}}}$$

With a leakage inductance of greater than or equal to 10% of the individual inductance of the first or second inductor, the following coupling factor results:

$$k = \sqrt{1 - \frac{0.1}{1}} = 0.949$$

and a total inductance is $$L_{tot} = L_1 + L_2 + k \cdot (L_1 + L_2)$$

With an approximation that the two individual inductances are of equal magnitude (L1=L2), the total inductance results as follows:

$$L_{tot} = L_1 \cdot (2 + 2k)$$

When k=0.95, the total inductance is therefore $L_{tot}$=3.9× L1.

The individual inductances of the inductors with a coupled arrangement can in each case be measured separately for each inductor. In particular, the individual inductance of the first or second inductor can be measured while the connections of the respective other inductor are open. The leakage inductance, on the other hand, is measured by the connections of the other inductor being short-circuited.

The invention is based on the consideration that it is possible in principle to achieve correspondence of the total inductance of the two inductors in the ideal case to twice the sum of the individual inductances by virtue of magnetic coupling of the two inductors. This is because, by virtue of the magnetic coupling, a coupling factor needs to be taken into consideration in the determination of the total inductance. It is thus possible to reduce the individual inductances of the inductors by magnetic coupling of the two inductors without changing the value of the total inductance, however.

However, in practice, a high level of coupling of the individual inductances results in undesired effects. Ideally, the diagonally arranged switching devices switch simultaneously. Owing to deviations, such as, for example, component tolerances, the switching of the switching devices in practice never takes place precisely simultaneously, however. This temporally shifted switching results in high induced compensation currents in the inductors in the case of ideal coupling of the two inductors, which compensation currents can cause increased heating both in the case of the switching devices and in the case of the low-pass filter device and result in destruction of individual components. Furthermore, the compensation currents can also result in problems with electromagnetic compatibility owing to the rapid current rise.

For this reason, the invention proposes not implementing a high level of or ideal coupling of the inductors, but instead only coupling the inductors loosely and therefore setting the magnetic coupling in an intermediate range between ideally coupled and uncoupled. In this way, the negative effects, in particular the induction of compensation currents, are reduced, but at the same time positive effects, such as the use of inductors with small dimensions when the same total inductance is reached, can be maintained. Therefore, this design represents a particularly advantageous region between ideally coupled inductors and uncoupled inductors.

In a preferred design configuration of the invention, the low-pass filter device has a capacitor, wherein the capacitor is arranged in parallel with the load. In particular, the capacitor is connected between the inductors and the load. The capacitor forms a short-circuiting device for relatively high frequencies.

In a preferred configuration of the invention, the low-pass filter device is configured such that it has a limit frequency of greater than 30 kilohertz, preferably greater than 50 kilohertz. Therefore, all of the signal components of the intermediate signal below this limit frequency are allowed to pass through to the load and signal components above the limit frequency are damped. By virtue of this design, the amplified, pulse-width-modulated intermediate signal is converted into the amplified audio output signal.

In a possible embodiment of the invention, the low-pass filter device has a symmetrical design, wherein the individual inductances of the two inductors are equal in size or differ from one another, starting from the larger inductor, by less than 15% in the individual inductance. This configuration supports a symmetrical design of the amplifier arrangement.

It is particularly preferred that the total inductance of the two inductors is between three times and 3.9 times the value of the averaged individual inductance. In this value range, the inductors can have correspondingly smaller dimensions and savings can be made in this way.

In a preferred development of the invention, the first inductor and the second inductor are arranged on a common inductor core, wherein the first and second inductors are arranged coaxially and concentrically with respect to one another, wherein, however, an isolating device is arranged between the first and second inductors in order to reduce the magnetic coupling. In a possible configuration, the isolating device is in the form of a sleeve, wherein the sleeve is likewise arranged coaxially and/or concentrically with respect to the first and second inductors. In this configuration, the inductors can be arranged with the desired loose coupling in a space-saving manner. Particularly preferably, the first and second inductors are each in the form of a coil, wherein the number of turns of the two coils is identical. In this way, the individual inductances are the same or within a deviation of 15%.

In a possible design configuration, the inductor core is in the form of a ferrite core, in particular an E core or in the form of a PQ core. Both the E core and the PQ core have two core halves, wherein each of the core halves is roughly in the form of an "E".

In a preferred design embodiment of the invention, the first and second inductors form a common inductor assembly, wherein the inductor assembly is in the form of a component with four connections. By virtue of this embodiment, the advantage of the components with reduced dimensions is continued, wherein two components can be combined to form a common component. By reducing the number of components in the amplifier arrangement, the mounting of said components is correspondingly simplified and made less expensive. The inductor assembly as one component has four connections, which are electrically conductively connected to the load output points or the load.

In a particularly preferred design embodiment of the invention, the connections are in the form of connection legs, in particular pins.

In a preferred embodiment of the invention, the output power of the amplifier arrangement is greater than 10 watts, wherein the output power is the maximum continuous power which can be provided on connection of the rated impedance in the case of a feed with pink noise in accordance with DIN 45324.

BRIEF DESCRIPTION OF THE DRAWINGS

Further features, advantages and effects of the invention result from the description below relating to a preferred exemplary embodiment of the invention and the attached figures, in which.

DETAILED DESCRIPTION

Figure 1:
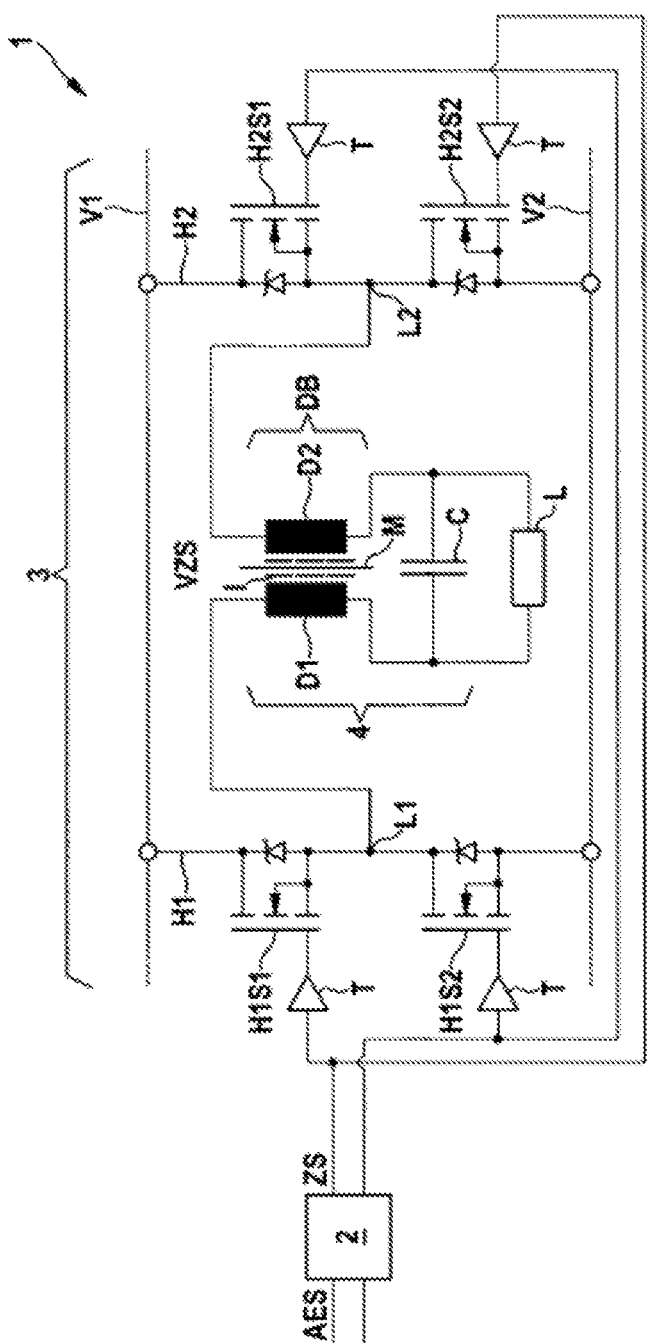
FIG. 1 shows a schematic illustration of an amplifier arrangement as a first exemplary embodiment of the invention.

FIG. 1 shows a schematic block diagram of an amplifier arrangement 1 as an exemplary embodiment of the invention. The amplifier arrangement 1 can also be referred to as a Class D amplifier, in particular the amplifier arrangement 1 can be referred to as a Class AD amplifier with two-stage pulse width modulation.

The amplifier arrangement 1 has a PWM module 2, into which an audio input signal AES is coupled via an interface. The PWM module 2 has a comparator, whose inputs are connected to a delta voltage and the audio input signal. The comparator compares the two voltages and outputs a high signal or a low signal at its output depending on whether the instantaneous value of the audio input signal AES is above or below the instantaneous value of the delta voltage. The result at the output of the PWM module 2 is a square-wave function, whose instantaneous pulse width corresponds to the instantaneous amplitude value of the audio input signal AES. The output signal can be referred to as a pulse-width-modulated intermediate signal ZS.

The pulse-width-modulated intermediate signal ZS is supplied to a wiring arrangement 3, to which a supply voltage is supplied via a first supply line V1 and a second supply line V2.

A first half-bridge H1 and a second half-bridge H2 are arranged between the supply lines V1 and V2. Together, the half-bridges H1 and H2 form a full-bridge configuration. The half-bridges H1 and H2 are arranged electrically in parallel with one another and are each connected electrically in series between the first and second supply lines V1, V2.

Each of the two half-bridges H1, H2 has two switching devices H1S1, H1S2 and H2S1 and H2S2. The switching devices are arranged in series with one another in the half-bridges H1, H2, wherein a first load output point L1 and a second load output point L2 are arranged between the switching devices H1S1-H1S2 and H2S1-H2S2, respectively.

The switching devices H1S1, H1S2, H2S1, H2S2 are actuated via the intermediate signal ZS, wherein the switching device H1S1 of the first half-bridge H1 is actuated in parallel with the switching device H2S2 of the second half-bridge H2 which is arranged diagonally thereto, and the switching device H1S1 of the first half-bridge H1 is actuated in parallel with the switching device H2S1 of the second half-bridge H2. Therefore, the switching devices which are arranged diagonally with respect to one another are actuated at the same time and in parallel by the intermediate signal ZS.

The switching devices H1S1, H1S2, H2S1, H2S2 are in the form of power switches, for example MOSFETs, wherein in each case drivers T for the switching devices are actuated via the intermediate signal ZS.

Therefore, in a first switching state, for example in a logic high state, the circuit arrangements H1S1-H2S2 which are arranged diagonally with respect to one another are closed, and the switching device H1S2-H2S1 is open and, in a second switching state, for example in a logic low state, the switching device H1S1-H2S2 is open and the switching device H1S2-H2S1 is closed. By virtue of the circuit arrangement 3, the intermediate signal ZS is amplified and converted into an amplified intermediate signal VZS, which is fed to a low-pass filter device 4 and, downstream thereof, to a load L in the form of a loudspeaker.

The low-pass filter device 4 has a first inductor D1, a second inductor D2 and a capacitor C. The first inductor D1 is arranged between the first load output point L1 and the load L, and the second inductor D2 is arranged between the second load output point L2 and the load L. The capacitor C is connected in parallel with the load L. In alternative exemplary embodiments, the capacitor C can also be connected to ground.

The first and second inductors D1 and D2 are magnetically coupled to one another, as is visualized by the vertical line M. The inductors D1 and D2 are coupled to one another in the same direction so that a total inductance of the inductor assembly DB formed by the inductors D1 and D2 is greater than the sum of the individual inductances of the inductors D1 and D2.

However, ideal coupling, wherein the total inductance would virtually correspond to twice the sum of the individual inductances of the inductors D1 and D2, is not implemented in the inductor assembly DB. Instead, the inductors D1 and D2 are only loosely coupled to one another and are in particular spaced apart from one another by an insulating device I in order to actively impair the coupling. The insulating device I has, for example, a thickness of at least one millimeter, preferably of at least two millimeters.

From a functional point of view, the inductor assembly DB is designed such that a leakage inductance of the inductor assembly DB corresponds approximately to 10% of the individual inductance of the inductor D1 or D2. As an alternative or in addition, it can also be stated that a coupling factor K of the inductor assembly DB corresponds to approximately 0.95. This results in a total inductance which corresponds to 3.9 times an individual inductance in the case of approximately equal individual inductances of the inductors D1 and D2.

By virtue of the loosely coupled inductors D1 and D2, it is firstly achieved that, in the case of a different response of the diagonally coupled switching devices H1S1-H2S2 or H1S2-H2S1, induced compensation currents are markedly reduced compared to the configuration where the inductors D1 and D2 are ideally coupled to one another owing to different switching times. On the other hand, the individual inductances of the inductors D1 and D2 can be reduced in magnitude, with the result that installation space and therefore material can be saved.

Figure 2:
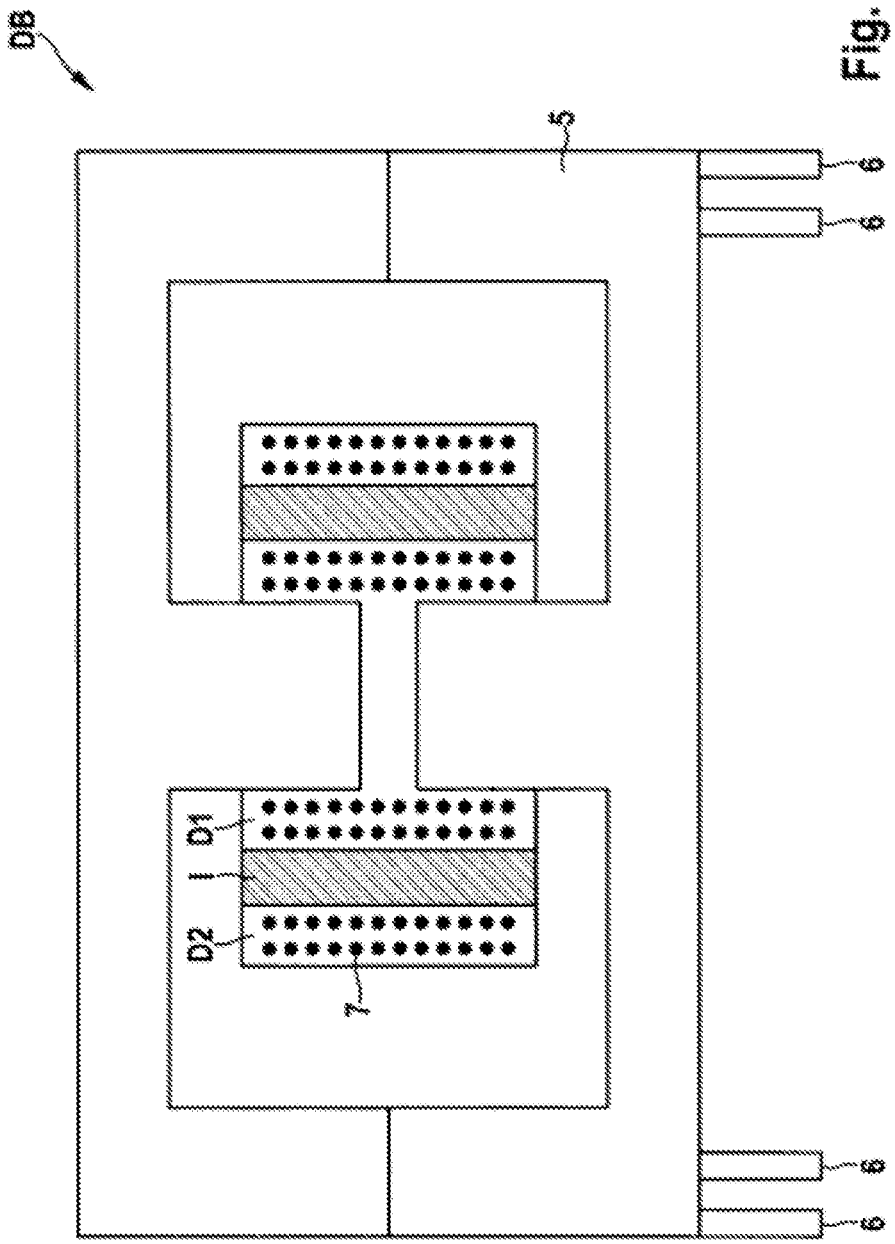
FIG. 2 shows a schematic sectional illustration of an inductor assembly in the amplifier arrangement shown in FIG. 1.

FIG. 2 shows a very schematized sectional illustration of components of the inductor assembly DB. The figure shows an inductor core 5 consisting of a magnetic material, the core halves of said core each being in the form of a horizontal E with facing limbs. Such inductor cores 5 are also referred to as E cores or, in an alternative configuration, as PQ cores, for example.

The first inductor D1 is arranged coaxially on the inside on the central limb of the inductor core 5. The second inductor D2 is positioned coaxially and concentrically with respect to the first inductor D1. The insulating device I, which in this configuration has the form of a sleeve and has a single thickness of greater than one millimeter, in this example approximately two millimeters, is arranged between the first inductor D1 and the second inductor D2. The insulating device I serves to decouple the inductors D1 and D2. The inductors D1 and D2 each have the same number of turns 7.

The inductor assembly DB has the joint inductor core 5 and, in addition, shown in very schematized form, four legs 6, which are designed for mounting and making electrical contact with the inductor assembly DB on a printed circuit board or the like. In this specific design configuration, the inductor assembly DB can be mounted as a single component in the amplifier arrangement 1.

The invention claimed is:

1. An amplifier arrangement for amplifying an audio input signal, the amplifier arrangement comprising:
    a PWM module for converting the audio input signal into a pulse-width-modulated intermediate signal; and
    a wiring arrangement with a full-bridge configuration including a first and a second half-bridge;
    wherein the first and second half-bridges are arranged in parallel with one another between a first supply line and a second supply line of a voltage supply, wherein the first half-bridge has first and second switching devices and the second half-bridge has first and second switching devices, which are connected in series between the first and second supply lines,
    wherein a first load output point is formed between the switching devices of the first half-bridge, and a second load output point is formed between the switching devices of the second half-bridge,
    wherein the switching devices of the first and second half-bridges are actuated via the pulse-width-modulated intermediate signal in such a way that, in a first state, in each case one switching device of the half-bridges is switched on so that the first load output point is conductively connected to the first supply line and the second load output point is conductively connected to the second supply line, and, in a second state, the respective other switching devices are switched on so that the first load output point is conductively connected to the second supply line, and the second load output point is conductively connected to the first supply line, and
    wherein the load output points are passed or can be passed via a low-pass filter device to a load, wherein the low-pass filter device has a first inductor, a second inductor, and a capacitor, wherein the first inductor is arranged between the first load output point and the load, and the second inductor is arranged between the second load output point and the load, wherein the first and second inductors are coupled to one another so that the total inductance of the two inductors is greater than the sum of the individual inductances of the two inductors and also less than or equal to 1.95 times the sum of the individual inductances of the two inductors.

2. The amplifier arrangement according to claim 1, wherein the low-pass filter has a capacitor, wherein the capacitor is arranged in parallel with the load.

3. The amplifier arrangement according to claim 1, wherein the low-pass filter device has a limit frequency of greater than 30 kHz.

4. The amplifier arrangement according to claim 1, wherein the individual inductances of the inductors are equal in magnitude or differ from one another by less than 15%.

5. The amplifier arrangement according to claim 1, wherein the total inductance is between three times and 3.9 times the value of the averaged individual inductances of the inductors.

6. The amplifier arrangement according to claim 1, wherein the first inductor and the second inductor are arranged on a common inductor core, wherein an isolating device is arranged between the first and second inductors.

7. The amplifier arrangement according to claim 6, wherein the common inductor core includes a ferrite core.

8. The amplifier arrangement according to claim 6, wherein the common inductor core is in the form of an E core or in the form of a PQ core.

9. The amplifier arrangement according to claim 1, wherein the first and second inductors form a common inductor assembly having four connections.

10. The amplifier arrangement according to claim 9, wherein the connections include connection pins.

11. The amplifier arrangement according to claim 1, wherein an output power at the load is greater than 10 watts.

* * * * *